PULSED R-F AMPLIFIER

Filed Aug. 20, 1952

INVENTORS
SVEN H. M. DODINGTON
CLARK R. WILSON
BY Percy P. Lantzy
ATTORNEY

United States Patent Office 2,753,525
Patented July 3, 1956

2,753,525

PULSED R. F. AMPLIFIER

Sven H. M. Dodington, Nutley, and Clark R. Wilson, Glen Ridge, N. J., assignors to International Telephone and Telegraph Corporation, a corporation of Maryland Application August 20, 1952, Serial No. 305,488

4 Claims. (Cl. 332—9)

This invention relates to pulsed radio-frequency (R.-F.) amplifiers and more particularly to chain arrangements of amplifier stages.

It is an object of this invention to provide means to apply modulator pulses progressively to R.-F. stages in such a manner that the pulse rise time is preserved.

Another object of this invention is to apply a plate voltage to each stage of a pulsed R.-F. amplifier at the same time that maximum grid drive occurs.

A further object of this invention is to provide means in association with a series of amplifier stages to reduce the pulse rise time and decay time heretofore experienced when a modulator pulse was applied to such series of amplifier stages.

One feature of this invention comprises the use of a delay line in the circuit of a chain of R.-F. amplifier stages. The R.-F. bypass capacitors of the amplifiers are utilized to provide the capacitance of the delay line, and the terminating resistance of the circuit is made equal to the impedance of the final stage.

The above-mentioned and other features and objects of this invention will become more apparent by reference to the following description taken in conjunction with the accompanying drawings, in which.

Figure 1:
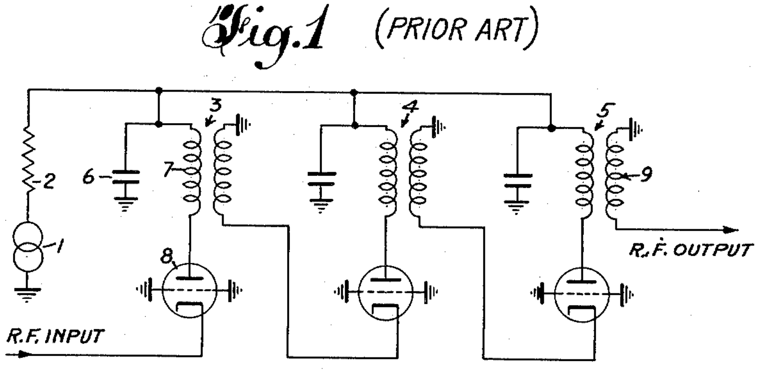
Fig.1 (PRIOR ART)
Fig. 1 is a circuit diagram of a typical prior art chain of amplifier stages pulsed on their plates by a modulator.
Figure 2:
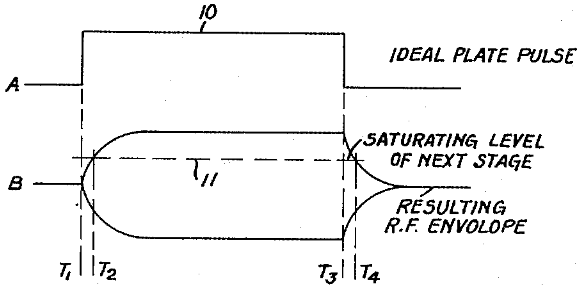
Fig. 2 is a graphic illustration of a set of curves helpful in the explanation of this invention.

Referring to Fig. 1, a known typical chain of pulsed R.-F. amplifier stages is shown wherein each stage is pulsed on its plate by a pulse modulator 1. A modulating pulse from modulator 1 is coupled through resistance 2 to the plate circuits of amplifier stages 3, 4, and 5. Each amplifier stage comprises a bypass condenser 6 and inductive reactance 7 in the plate circuit of a vacuum tube 8. The input to each stage is fed to the cathode of vacuum tube. The R.-F. input is fed to stage 3 through the cathode where it is modulated with the pulse from modulator 1 applied to the plate circuit. The pulse modulated R.-F. energy from stage 3 is inductively coupled to the cathode of the vacuum tube of stage 4 where it is again modulated by the pulse applied to the plate circuit. Successive stages are modulated in a similar manner as is well known to those skilled in this art. The modulated R.-F. output is inductively coupled from the coil 9 in the plate circuit of final stage 5. In a typical three-stage amplifier the plate current drawn by the first stage 3 is approximately 10 per cent of that drawn by the final stage 5, which quite naturally draws the most current, while the intermediate stage 4 draws about 33 per cent of the current drawn by the final stage. Due to the large current drain by the final stage 5, it presents the lowest video impedance to the modulator 1, but all three stages present equal capacitive reactances to the modulator 1. The equal capacitive reactances are in parallel and adversely affect the applied pulse shape by increasing the periods of rise and decay of the modulator pulses. A further deterioration is caused by the finite buildup and decay time of the R.-F. circuits as shown in Fig. 2. Curve A represents the ideal plate pulse whereas curve B shows the resulting R.-F. envelope after modulation. It is obvious that while the plate pulse 10 is common to all stages and lasts from $T_1$ to $T_3$, sufficient grid drive on the succeeding stage is only available from $T_2$ to $T_4$ as shown by dotted line 11, which represents the saturating level of the next stage. Full power is then obtainable only from $T_2$ to $T_3$, which reduces the pulse duration while considerably increasing the rise time. If a plurality of stages are utilized, the condition is soon approached where no "flat top" remains to the modulating pulse because the total pulse duration is devoted to rise and decay.

Figure 3:
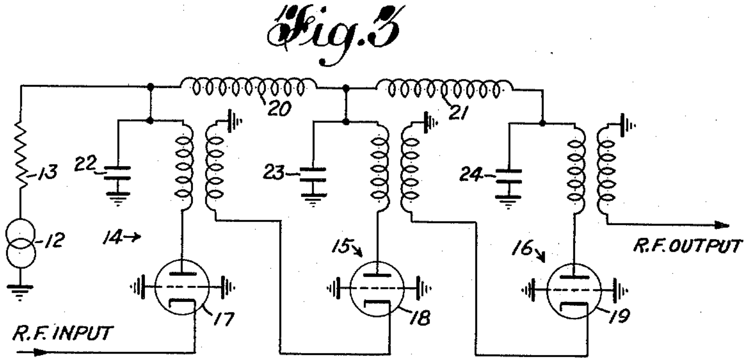
Fig. 3 is a circuit drawing of one embodiment of this invention employing a plurality of pulsed R.-F. amplifier stages.

Referring to Fig. 3, one embodiment of this invention is shown which provides means for applying the plate voltage to each stage at the same time that maximum grid drive occurs. This arrangement greatly reduces the effect of capacitive reactance on the modulator. A modulator 12 provides modulation pulses through resistor 13 to the plate circuits 14, 15, and 16 of vacuum tubes 17, 18, and 19. An inductive reactance 20 and 21 is inserted between plates of succeeding stages. Inductances 20 and 21 in cooperation with the R.-F. bypass condensers 22, 23, and 24 form delay lines which permit the modulator pulses to be applied to the plates of succeeding stages when the maximum grid drive occurs. The terminating resistance of the circuit is equal to the video impedance of the final stage, and the relatively high impedances of the intermediate amplifiers do not seriously mismatch the line, resulting in the modulator "seeing" only the first capacitor 22 and therefore retaining its pulse shape. In addition the delay in the line approximately matches the R.-F. delay in each stage so that the plate voltage of each stage is delayed until full grid drive is available. While the circuit of Fig. 3 is shown with three amplifier stages, it will be understood, of course, that there may only be two stages or, if desired, many more than the three illustrated.

Figure 4:
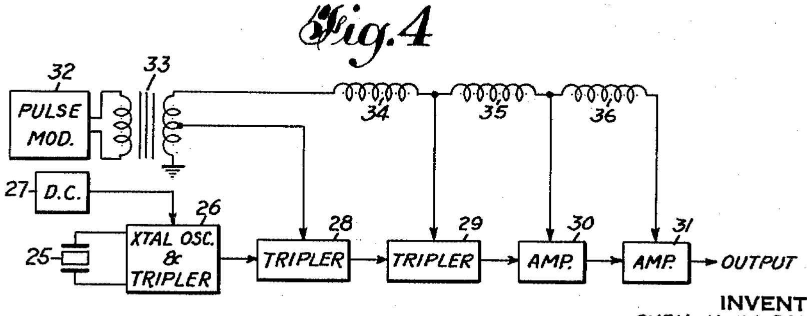
Fig. 4 is another embodiment of this invention in the form of a frequency multiplier chain.

The principle of this invention is particularly valuable in frequency multiplier chains where in order to obtain good doubling or tripling efficiency, relatively high Q R.-F. tank circuits are necessary. Such high Q circuits obviously result in slow rise and decay time. As shown in Fig. 4, a typical frequency multiplier chain comprising a crystal oscillator 25 vibrating at 40 mc. feeds a tripler 26. A D.-C. bias input is fed to tripler 26 from D.-C. source 27. The 120 mc. output of tripler 26 is fed to tripler 28 which in turn feeds its 360 mc. output to tripler 29. The 1080 mc. output of tripler 29 is coupled through a chain of amplifiers 30 and 31 and results in a high powered, high frequency signal output. A pulse modulator 32, inductively coupled through transformer 33 to each stage of the chain frequency multiplier, provides pulses to modulate the output of each stage. Inductances 34, 35, and 36 are inserted between succeeding stages and function as heretofore explained to provide a delay line to allow the plate voltage of each stage to be delayed until full grid drive is available. The principle of this invention is not limited to plate pulsing but can be utilized with any method of amplitude modulation of an R.-F. signal.

While we have described above the principles of our invention in connection with specific apparatus, it is to be clearly understood that this description is made only by way of example and not as a limitation to the scope of our invention as set forth in the objects thereof and in the accompanying claims.

We claim:

1. In a circuit for pulse modulating radio-frequency energy having a plurality of stages each of said stages including an electron discharge tube having at least a cathode, grid, and plate; a source of radio-frequency energy coupled to the cathode of the tube of the first of said stages, means to couple the plate output of the electron discharge tube of said first stage to the cathode of the succeeding stage, a source of modulating pulses, and means to couple said modulating pulses to the plate of the tubes of each of said stages, said means to couple including delay means to delay the time of coupling said pulses to successive stages until that time at which the maximum grid drive occurs at each respective stage.

2. In a circuit having a plurality of stages each having an electron discharge device, a source of modulating pulses, a source of radio-frequency energy, and means to couple the output of the first of said stages to one of the electrodes of each of said stages, said means to couple including delay means to delay the pulse application timing with respect to said stages whereby the shape of said modulating pulses throughout said stages is substantially preserved.

3. In a pulsed radio-frequency amplifier having an input stage, an intermediate stage and a final stage, each stage including an electron discharge device having at least a cathode, grid, and plate and a radio-frequency bypass capacitor, means to inductively couple the plate circuit of one stage to the cathode circuit of the next succeeding stage, means to couple the radio-frequency input to the cathode of said stages; the combination therewith of an inductive reactance disposed between the plate circuits of adjacent stages whereby said inductive reactance in conjunction with said bypass capacitor functions as a delay line to apply said modulator pulse to successive stages in a predetermined time sequence.

4. A circuit for pulse modulating a radio-frequency signal comprising a source of modulating pulses, a source of radio-frequency energy, a plurality of modulating stages each including an electron discharge device having at least a cathode, grid, and plate, means to inductively couple the plate circuit of the electron discharge device of the first stage to the cathode of the succeeding stage, means to couple said source of radio-frequency energy to the cathode of said first stage, means to apply modulating pulses to the plate circuit of all said stages, said last mentioned means having means to cause a time delay between the application of pulses to succeeding stages, and means to inductively couple the output from the plate circuit of the last stage.

References Cited in the file of this patent

UNITED STATES PATENTS

| | | |
|---|---|---|
| 2,524,821 | Montgomery | Oct. 10, 1950 |
| 2,571,045 | Macuae | Oct. 9, 1951 |
| 2,574,868 | Green | Nov. 13, 1951 |